(12) United States Patent
Matsuda et al.

(10) Patent No.: US 8,063,555 B2
(45) Date of Patent: *Nov. 22, 2011

(54) ORGANIC ELECTROLUMINESCENT DEVICE WITH SIN LAYER CONTAINING HYDROGEN AND FLUORINE

(75) Inventors: Koichi Matsuda, Kawasaki (JP); Yukito Aota, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/611,593

(22) Filed: Nov. 3, 2009

(65) Prior Publication Data

US 2010/0045178 A1 Feb. 25, 2010

Related U.S. Application Data

(62) Division of application No. 11/611,352, filed on Dec. 15, 2006, now Pat. No. 7,633,224.

(30) Foreign Application Priority Data

Dec. 22, 2005 (JP) .................................. 2005-370091
Nov. 10, 2006 (JP) .................................. 2006-305240

(51) Int. Cl.
*H01J 1/62* (2006.01)
*H01J 63/04* (2006.01)

(52) U.S. Cl. ......... 313/504; 313/498; 313/506; 313/512

(58) Field of Classification Search ........... 313/498–512
See application file for complete search history.

(56) References Cited

U.S. PATENT DOCUMENTS

| 4,659,639 | A | 4/1987 | Mizuno et al. ................. 430/65 |
| 5,452,061 | A | 9/1995 | Kojima et al. ................ 399/171 |
| 5,514,506 | A | 5/1996 | Takai et al. ................. 430/57.7 |
| 5,905,298 | A | 5/1999 | Watatani ....................... 257/635 |
| 5,989,693 | A | 11/1999 | Yamasaki et al. ............. 428/216 |
| 6,107,116 | A | 8/2000 | Kariya et al. .................. 438/87 |
| 6,503,557 | B1 | 1/2003 | Joret ............................. 427/167 |
| 7,183,197 | B2 | 2/2007 | Won et al. ..................... 438/622 |
| 7,633,224 | B2 * | 12/2009 | Matsuda et al. .............. 313/512 |
| 2004/0247885 | A1 | 12/2004 | Joret et al. .................... 428/421 |
| 2005/0067953 | A1 | 3/2005 | Yamazaki et al. ............ 313/506 |
| 2005/0221203 | A1 | 10/2005 | Fujii ................................. 430/5 |
| 2006/0158101 | A1 * | 7/2006 | Camilletti et al. ............ 313/504 |
| 2006/0257688 | A1 | 11/2006 | Schutze et al. ................ 428/697 |
| 2007/0222383 | A1 | 9/2007 | Matsuda ....................... 313/504 |
| 2009/0022997 | A1 | 1/2009 | Russo et al. .................. 428/432 |

FOREIGN PATENT DOCUMENTS

JP 7-169833 A 7/1995
JP 11-242994 9/1999

OTHER PUBLICATIONS

English Translation of the Office Action issued in Japanese counterpart application No. 2006-305240 dated Jul. 26, 2011- 3 pages.

* cited by examiner

*Primary Examiner* — Toan Ton
*Assistant Examiner* — Kevin Quarterman
(74) *Attorney, Agent, or Firm* — Fitzpatrick, Cella, Harper & Scinto

(57) ABSTRACT

An organic EL device includes a substrate; a layered structure including a first electrode, an organic layer, and a second electrode disposed on the substrate in this order; and laminated protective layers surrounding at least the layered structure. The protective layers are composed of silicon, nitrogen, hydrogen, and fluorine. The fluorine content in the outermost protective layer is in the range of 0.01 to 1.0 atomic percent.

4 Claims, 1 Drawing Sheet ically as a thin-film transistor (TFT), which controls the luminescence.

ORGANIC ELECTROLUMINESCENT DEVICE WITH SIN LAYER CONTAINING HYDROGEN AND FLUORINE

This application is a divisional application of U.S. application Ser. No. 11/611,352 filed Dec. 15, 2006, which claims priority of Japanese Patent Application Nos. 2005-370091, filed Dec. 22, 2005 and 2006-305240, filed Nov. 10, 2006. The contents of all of the aforementioned applications are hereby incorporated by reference herein in their entireties.

BACKGROUND OF THE INVENTION

1. Field of the Invention

The present invention relates to an organic electroluminescent (EL) device for use in emissive displays, surface-emitting light sources, and the like.

2. Description of the Related Art

In recent years, organic EL devices have actively been developed. Thus, technologies regarding protective layers for blocking the intrusion of moisture and oxygen from the outside have also been studied to make full use of their luminescence properties. Protective layers need to not only block the intrusion of moisture and oxygen, but also have excellent optical properties from the viewpoint of luminescence.

Japanese Patent Laid-Open No. 11-242994 discloses a silicon nitride protective layer formed by plasma chemical vapor deposition (CVD) at room temperature.

In protective layers formed of silicon nitride, there is a trade-off between the optical properties and the protective performance. Specifically, the silicon nitride protective layer just formed by plasma CVD as described in the patent document exhibits higher light absorption, as well as high protective performance. Thus, although the silicon nitride protective layer has a small deterioration rate of optical properties in an endurance test, its initial optical properties are poor. Hence, the silicon nitride protective layer hardly makes full use of high luminous efficiencies of recent organic ELs.

SUMMARY OF THE INVENTION

The present invention provides an organic EL device that includes a protective layer functioning as an excellent protective film and exhibiting excellent optical performance.

A first aspect of the present invention provides an organic EL device that includes
a substrate;
a layered structure including a first electrode, an organic layer, and a second electrode disposed on the substrate in this order, and
laminated protective layers disposed closer to a light extraction side than the second electrode;
wherein the protective layers are composed of silicon, nitrogen, hydrogen, and fluorine, and
each protective layer contains 0.01 to 1 atomic percent of fluorine.

A second aspect of the present invention provides an organic EL device that includes
a substrate;
a layered structure including a first electrode, an organic layer, and a second electrode disposed on the substrate in this order, and
laminated protective layers disposed closer to a light extraction side than the second electrode;
wherein the protective layers include
a first protective layer disposed on the substrate side, the first protective layer being composed of silicon, oxygen, hydrogen, and fluorine and being free of nitrogen, and
a second protective layer disposed on the light extraction side, the second protective layer being composed of silicon, nitrogen, hydrogen, and fluorine,
wherein the first protective layer contains 0.01 to 4 atomic percent of fluorine, and
the second protective layer contains 0.01 to 1 atomic percent of fluorine.

The fluorine content in the laminated protective layers according to the first aspect or the second aspect may decrease in a direction from the substrate side toward the light extraction side.

As described above, the present invention provides an organic EL device that includes a protective layer disposed on a light extraction side of a second electrode. The protective layer can maintains excellent luminescence properties of the organic EL device even under high temperature and high humidity and has excellent initial properties.

Further features of the present invention will become apparent from the following description of exemplary embodiments with reference to the attached drawings.

DESCRIPTION OF THE EMBODIMENTS

The present invention is described in detail below with reference to FIG. 1. However, it is to be understood that the present invention is not limited to an organic EL device illustrated in FIG. 1.

In the present embodiment, one of electrodes of an organic EL device is connected to a switching element, for example, a thin-film transistor (TFT), which controls the luminescence.

A plurality of organic EL devices according to the present embodiment may separately be placed on the same plane. Such organic EL devices can be utilized as picture elements of a display panel. Furthermore, an organic EL device according to the present invention can be used as a mono-color light-emitting apparatus. Alternatively, a plurality of organic EL devices according to the present invention can be used as a full-color light-emitting apparatus, in which the organic EL devices emit different colors.

Figure 1:
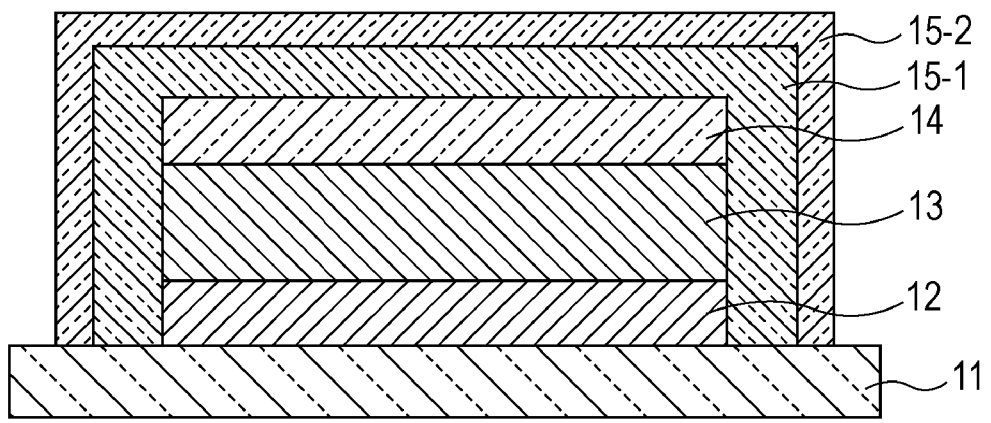
FIG. 1 is a schematic cross-sectional view of a layered structure of an organic EL device according to an embodiment of the present invention.

FIG. 1 illustrates a schematic cross-sectional view of an organic EL device according to an embodiment of the present invention. This organic EL device includes a glass substrate 11, a first electrode 12, an organic layer 13, a second electrode 14, a first protective layer 15-1, and a second protective layer 15-2.

An organic EL device according to the present invention essentially includes the first electrode 12, the organic layer 13, and the second electrode 14, and may further include the first protective layer 15-1 and the second protective layer 15-2 disposed on the second electrode 14, and may still further include a packed layer and a sealing substrate (both not shown). The organic layer 13 is composed of at least one sublayer. In addition to a luminescent sublayer, the organic layer 13 may include a positive hole transport sublayer, a positive hole injection sublayer, an electron transport sublayer, an electron injection sublayer, and/or a carrier-blocking sublayer. Alternatively, at least two of these sublayers may be combined to function as a luminescent sublayer.

The second electrode 14 is formed of a transparent electroconductive film of low resistance, such as indium tin oxide (ITO) or indium oxide ($In_2O_3$). The first electrode 12 is a reflecting anode that can have a large work function. For example, gold (Au), platinum (Pt), chromium (Cr), palladium (Pd), selenium (Se), iridium (Ir), copper iodide, or an alloy may be used.

Such a structure in which the substrate is closer to the reflecting electrode than the transparent electrode is referred to as a top emission structure. In the top emission structure, light emitted from the luminescent sublayer is extracted from the top of the organic EL device.

In the top emission structure, the protective layers 15-1 and 15-2, the packed layer, and the sealing substrate (both not shown) should be transparent to light emitted from the luminescent sublayer to send out the light without significant loss. The protective layers 15-1 and 15-2, the packed layer, and the sealing substrate according to the present embodiment are formed of colorless transparent materials. In addition, a circularly polarizing plate (for example, a composite polarizer of a linearly polarizing plate and a retardation plate, such as a λ/4 plate) may be attached directly to the top of the protective layer 15-2.

A protective layer according to one embodiment of the present invention is described below.

The protective layers 15-1 and 15-2 are inorganic films composed of silicon, nitrogen, and hydrogen and contain fluorine (F). Fluorine may reduce structural defects in the protective layers 15-1 and 15-2, though the reason for this is not clear.

The structural defects are associated with the structures of the protective layers. Specifically, because each protective layer is formed of an amorphous material, the interatomic distances are not uniform and vary locally. An amorphous material may grow differently in a manner that depends on the state of the growth surface. The amorphous material may therefore locally have a higher internal stress. The locally higher internal stress may cause microscopical detachment of the organic layer, which results in an image defect.

Heretofore, to reduce such defects, the thickness of a protective layer may be increased to block the detachment, though this causes an increase in cost. Alternatively, a protective layer having high protective performance may be used while the optical properties are not a little compromised. However, these countermeasures have insufficient effects.

The present invention incorporates more effective fluorine into a protective layer. Fluorine can activate the surface reaction during film formation. In addition, strong bonding between fluorine and other atoms allows the protective layer to be structurally stable, uniform, and less defective even when a protective layer is formed at low temperature (room temperature). Such beneficial effects can be achieved when the fluorine content in a protective layer is at least 0.01 atomic percent.

However, an increase in the fluorine content may cause an increase in hygroscopicity. Actually, when the fluorine content in a protective layer exceeds 1.0 atomic percent, a fracture or detachment in the protective layer probably due to expansion of the protective layer is observed and may cause a deterioration in protective performance. Hence, the fluorine contents in the first protective layer 15-1 and the second protective layer 15-2 can be in the range of 0.01 to 1.0 atomic percent of the total constituent atoms.

In addition, even when the fluorine contents in the protective layers are within this range, not a little moisture absorption is caused by fluorine. A region in the vicinity of the top surface of the protective layers can therefore contain less fluorine. In other words, the fluorine content can decrease in a direction from the substrate side toward the light extraction side in a continuous or stepwise manner.

When the fluorine contents in the protective layers are within the range described above, the optical properties of the protective layer remain unchanged. Hence, when fluorine is added to a protective film having optical properties designed for a raw material gas containing, for example, silicon and nitrogen to improve the protective characteristics, the optical properties and the protective characteristics can independently be controlled. This increases flexibility in determining the ratio of major elements, that is, silicon, nitrogen, and hydrogen, of the protective layer.

An objective of providing the laminated protective layers is to block intrusion path of moisture and oxygen from the outside. Thus, when the intrusion path occurs in the protective layer 15-1, the film formation may temporarily be stopped after the protective layer 15-1 is formed. Then, the protective layer 15-2 may be formed under different conditions. Alternatively, the formulations of the protective layers 15-1 and 15-2 may continuously be changed to block the intrusion path without stopping the film formation. For example, the fluorine content in the protective layer 15-1 can be greater than the fluorine content in the protective layer 15-2.

The compositions of the protective layers can be in the following range, as determined by a Rutherford scattering spectrum (RBS) method. The RBS method can analyze the composition in the depth direction.

The protective layer 15-2 can contain 29 to 40 atomic percent of silicon and 36 to 50 atomic percent of nitrogen. The ratio of nitrogen to silicon can be 1.0 to 1.43.

The protective layer 15-1 can contain 10 to 50 atomic percent of hydrogen.

The protective layers 15-1 and 15-2 contain no detectable oxygen (about less than 1 atomic percent).

A protective layer according to another embodiment of the present invention is described below.

The protective layer 15-1 is an inorganic film composed of silicon, oxygen, and hydrogen and is free of nitrogen. The protective layer 15-1 contains fluorine (F). The protective layer 15-2 is an inorganic film composed of silicon, nitrogen, and hydrogen and contains fluorine (F).

Fluorine in the protective layers has the effects as described above. The relationship between the fluorine content in a protective layer and the protective performance depends on the composition of the protective layer. The protective layer 15-1 can have excellent protective performance when the fluorine content is in the range of 0.01 to 4.0 atomic percent of the total constituent atoms.

When the fluorine content in the protective layer 15-1 is within this range, its optical properties remain unchanged, as described above. Hence, when fluorine is added to a protective film having optical properties designed for a raw material gas containing silicon and oxygen to improve the protective characteristics, the optical properties and the protective characteristics can independently be controlled.

In particular, different optical designs can be applied to the protective layer 15-1 composed of silicon, oxygen, and hydrogen and free of nitrogen and to the protective layer 15-1 composed of silicon, nitrogen, and hydrogen. Depending on the performance required for the organic EL device, each protective layer can appropriately be designed. In general, a protective layer composed of silicon, oxygen, and hydrogen and free of nitrogen exhibits lower light absorption and has a lower refractive index than those of a protective layer composed of silicon, nitrogen, and hydrogen.

As described above, an objective of providing the laminated protective layers is to block intrusion path of moisture and oxygen from the outside. Lamination of the protective layer 15-1 and the protective layer 15-2 having different compositions is therefore more effective.

The compositions of the protective layers can be in the following range, as determined by a Rutherford scattering spectrum (RBS) method.

The composition of the protective layer 15-2 is in the range described above.

The protective layer 15-1 can contain 20 to 40 atomic percent of silicon and 40 to 80 atomic percent of oxygen. The ratio of oxygen to silicon can be 1.5 to 2.5. The protective layer 15-1 can contain 10 to 50 atomic percent of hydrogen. The protective layer 15-1 contains no detectable nitrogen (about less than 1 atomic percent).

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

EXAMPLES

Reference Example

First, a protective monolayer was evaluated.
[Formation of Protective Monolayer on Glass Substrate]
An electron injection sublayer having a predetermined thickness among organic sublayers used in the following examples was deposited on a glass substrate having a thickness of 0.8 mm. Then, ITO was deposited on the electron injection sublayer by sputtering to form a transparent electrode layer having a thickness of 100 nm. Then, a protective monolayer composed of silicon, nitrogen, hydrogen, and fluorine was formed in the following manner.

A film-forming apparatus is a plasma CVD apparatus utilizing high frequency power. High frequency power is applied to a raw material gas flowing through parallel-plate electrodes to generate glow discharge. A protective layer is formed on the glass substrate.

A $SiH_4$ gas, a $SiF_4$ gas, and a $N_2$ gas were introduced at various ratios at a pressure of 100 Pa and at room temperature without heating the substrate. The power applied to the electrodes was 5 to 100 W.

The fluorine content was varied between 0.001 and 2.0 atomic percent by changing the composition of the raw material gas and other conditions.
[Evaluation of Protective Monolayer Formed on Glass Substrate]
The protective monolayer formed on the glass substrate was evaluated as follows.
(1) Cross-cut Test
Vertical and horizontal cuts each having a length of 20 mm at 1 mm spacing were made on a predetermined region of a protective monolayer containing fluorine as shown in Table 1. A cellophane adhesive tape was attached to the region so that all the 1 $mm^2$ cut squares were in intimate contact with the tape. Then, the tape was peeled at an angle of 180° according to an ASTM specification. The area of the protective monolayer peeled together with the tape was measured. The protective monolayer was not peeled off by one peeling test. Thus, a plurality of peeling tests was performed. Table 1 shows the results. The peeled area is indicative of the adhesiveness of the protective film. A larger peeled area indicates poorer adhesion. Table 1 shows the reciprocal of the peeled area as a measure of the adhesiveness, normalized to the value of a protective film containing 0.01 atomic percent of fluorine (reference example 1-2). A lower relative value indicates poorer adhesion.
(2) Evaluation of Moisture Barrier Property
The moisture barrier property was determined with a glass substrate on which metallic calcium was deposited. A glass substrate was placed in a deposition apparatus, in which the glass substrate can be conveyed in vacuo between a protective layer-forming chamber (CVD) and a metal calcium deposition chamber. Calcium was evaporated onto the glass substrate at a predetermined thickness. A protective layer containing fluorine as shown in Table 1 was formed on the metal calcium. This specimen was placed in an atmosphere of 100% RH at 121° C. and 0.2 MPa for 100 hours. Then, the light transmittance of the specimen was measured. Moisture passing through the protective layer reacted with calcium to yield calcium hydroxide. The relationship between the light transmittance and the fluorine content was examined. While calcium exhibits low optical transparency, calcium hydroxide exhibits high optical transparency.

Thus, the light transmittance is indicative of the moisture barrier property of the protective film. A larger light transmittance indicates a poorer moisture barrier property. Table 1 shows the reciprocal of the light transmittance as a measure of the moisture barrier property, normalized to the value of the protective film containing 0.01 atomic percent of fluorine (reference example 1-2). A lower relative value indicates a poorer moisture barrier property.

TABLE 1

| Sample No. | Fluorine content (atomic %) | Cross-cut test (relative value) | Moisture barrier property (relative value) |
| --- | --- | --- | --- |
| Reference example 1-1 | 0.005 | 0.77 | 0.79 |
| Reference example 1-2 | 0.01 | 1.00 | 1.00 |
| Reference example 1-3 | 0.1 | 1.03 | 0.97 |
| Reference example 1-4 | 1.0 | 1.05 | 0.96 |
| Reference example 1-5 | 1.2 | 0.97 | 0.88 |
| Reference example 1-6 | 2.0 | 0.98 | 0.89 |

As seen in Table 1, when the fluorine content in the protective layer is in the range of 0.01 to 2.0 atomic percent, detachment, for example, caused by internal stress did not occur in the protective layer and also in the underlying organic layer and the cathode layer. When the fluorine content in the protective layer is in the range of 0.01 to 1.0 atomic percent, the protective layer exhibited an excellent moisture barrier property.

An organic EL device according to the present invention is further described in the following examples. However, the present invention is not limited to these examples.

Example 1

Figure 2:
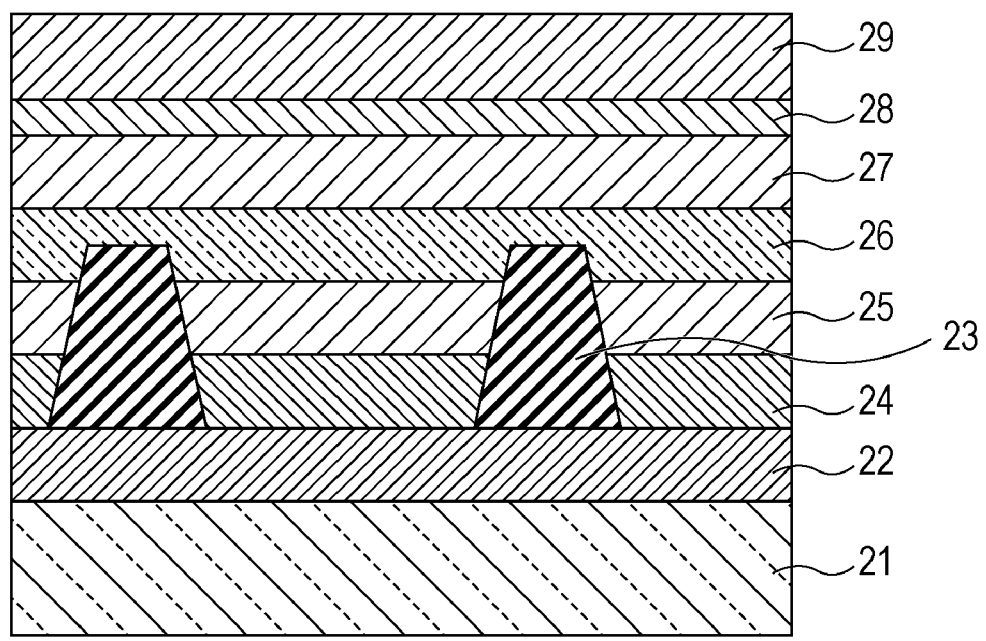
FIG. 2 is a schematic diagram of a layered structure of an organic EL device according to another embodiment of the present invention.

FIG. 2 illustrates an organic EL device including protective layers formed in the same way as that in the reference example. The organic EL device includes a glass substrate 21, a TFT circuit 22, a device isolation film 23, a first electrode 24, an organic layer 25, a second electrode 26, a first protective layer 27, a second protective layer 28, and a polarizer 29. The TFT circuit 22 was formed on the glass substrate 21 having a thickness of 0.7 mm. The first electrode 24 composed of chromium was formed on the TFT circuit 22. Then, a polyimide isolation film 23 was formed to produce a device substrate. The organic layer 25 was formed on the chromium electrode 24 of the device substrate. The organic layer 25 included a hole transport sublayer, a luminescent sublayer, an electron transport sublayer, and an electron injection sublayer laminated from the bottom to the top. Then, ITO was deposited on the organic layer by sputtering to form a transparent electrode layer 26 having a thickness of 100 nm.

[Formation of Protective Layer]

The specimen was conveyed to another film-forming chamber. The first protective layer 27 composed of silicon, nitrogen, hydrogen, and fluorine was formed on the second electrode 26, as described in the reference example. The first protective layer 27 had a thickness of 2 μm. The fluorine content in the first protective layer 27 was adjusted to 1.0 atomic percent by controlling the composition of a raw material gas.

After the film formation was temporarily stopped, the second protective layer 28 containing fluorine as shown in Table 2 was formed on the first protective layer 27 in the same way as the first protective layer 27. The second protective layer 28 had a thickness of 1 μm. While the contents of silicon, nitrogen, and hydrogen in the second protective layer 28 varied with the adjustment of the fluorine content, they were within the range described above.

Furthermore, as in the reference example, each element content in the deposited films was held constant.

The organic EL device thus formed was connected to a driving power supply at the first electrode 24 and the second electrode 26. The luminous efficiency of the organic EL device was determined. An additional specimen was prepared in the same way as the specimen for the evaluation of luminous efficiency. Two analyses were performed to measure the fluorine content in a protective layer and to determine a fluorine-rich region and a fluorine-poor region. A Rutherford scattering spectrum (RBS) analysis and a resonant nuclear reaction analysis (NRA) were performed.

[Evaluation of Organic EL Device]

The luminance of an organic EL device was measured at a constant electric current before and after an endurance test under high temperature and high humidity. The luminous area after an endurance test under high temperature and high humidity varied with the conditions under which a protective film was formed. Since the luminance may be proportional to the luminous area, the luminance was regarded as the evaluation criterion for the luminescence properties.

An organic EL device including the second protective layer 28 containing fluorine as shown in Table 2 was subjected to an endurance test under high temperature and high humidity. Specifically, an organic EL device was placed in an atmosphere of 90% RH at 60° C. for 1000 hours. The deterioration rate was calculated from the luminances before and after the endurance test. Table 2 shows the deterioration rate together with the initial luminance.

When the second protective layer 28 composed of silicon, nitrogen, and hydrogen contained 0.01 to 1.0 atomic percent of fluorine according to the present invention, deterioration in luminance under high temperature and high humidity was reduced, and no dark spot was observed. The results demonstrated that an organic EL device according to the present invention exhibited high stability. In addition, when the second protective layer 28 contained 0.01 to 1.0 atomic percent of fluorine, the organic EL device had high initial luminance.

TABLE 2

| Sample No. | Fluorine content in first protective layer (atomic %) | Fluorine content in second protective layer (atomic %) | Deterioration rate in endurance test (relative value) | Initial luminance (relative value) | Overall rating |
|---|---|---|---|---|---|
| Comparative example | 1.0 | 0.005 | 79.0 | 0.91 | Poor |
| Example 1-1 | | 0.01 | 100.0 | 1.00 | Excellent |
| Example 1-2 | | 0.1 | 100.0 | 1.01 | Excellent |
| Example 1-3 | | 1.0 | 97.0 | 1.02 | Good |
| Comparative example | | 1.2 | 81.5 | 0.84 | Poor |
| Comparative example | | 2.0 | 79.5 | 0.74 | Poor |

Deterioration rates in endurance test and Initial luminances are relative values normalized to the values of Example 1-1.

Example 2

A specimen including a glass substrate 21, a TFT circuit 22, a device isolation film 23, a first electrode 24, an organic layer 25, and a second electrode 26 was formed in the same way as in Example 1.

The specimen was conveyed to another film-forming chamber. A first protective layer 27 composed of silicon, nitrogen, hydrogen, and fluorine was formed on the second electrode 26, as described in Example 1. The first protective layer 27 had a thickness of 2 μm. The fluorine content in the first protective layer 27 was adjusted to the value shown in Table 3 by controlling the film-forming conditions. As in Example 2, while the contents of silicon, nitrogen, and hydrogen in the first protective layer 27 varied with the adjustment of the fluorine content, they were within the range described above.

After the film formation was temporarily stopped, a second protective layer 28 containing fluorine as shown in Table 3 was formed on the first protective layer 27 in the same way as the first protective layer 27. The second protective layer 28 had a thickness of 1 μm.

Furthermore, as in Example 1, each element content in the protective layers 27 and 28 was held constant.

The organic EL device thus formed was connected to a driving power supply at the first electrode 24 and the second electrode 26. The luminous efficiency of the organic EL device was determined. An additional specimen was prepared in the same way as the specimen for the evaluation of luminous efficiency, and the fluorine contents in the protective layers were measured, as in Example 1.

[Evaluation of Organic EL Device]

As described above, the luminescence properties of the organic EL device thus formed were determined before and after an endurance test under high temperature and high humidity.

An organic EL device including the first protective layer containing fluorine as shown in Table 3 was subjected to an endurance test in an atmosphere of 90% RH at 60° C. for 1000 hours, as in Example 1. The luminescence properties were determined after the endurance test. Table 3 shows the results. An organic EL device that includes the first protective layer and the second protective layer both manufactured under the same conditions was fixed on a metal plate and was dropped from a height of 70 cm (drop impact of about 10 G). After the drop impact test was performed twice, the organic EL device was subjected to an endurance test in an atmosphere of 90% RH at 60° C. for 250 hours. The luminescence properties were determined after the endurance test. Table 3 shows the results.

When the first protective layer composed of silicon, nitrogen, and hydrogen contained 0.01 to 1.0 atomic percent of fluorine according to the present invention, deterioration in luminance under high temperature and high humidity was reduced, and no dark spot was observed. The results demonstrated that an organic EL device according to the present invention exhibited high stability. When the fluorine content was greater than 1.0 atomic percent, a dark spot probably caused by a fracture of the first protective layer was observed. When the first protective layer contained 0.01 to 1.0 atomic percent of fluorine according to the present invention, the first protective layer showed less deterioration in protective performance under high temperature and high humidity and was resistant to a physical impact. The results demonstrated that an organic EL device including the first protective layer according to the present invention exhibited high stability.

composed of silicon, nitrogen, and hydrogen and containing fluorine as shown in Table 4 was formed on the first protective layer 27. The second protective layer 28 had a thickness of 1 µm. As in Example 2, each element content in the protective layers 27 and 28 was held constant.

As in Example 2, the luminous efficiency of the organic EL device thus formed was determined. An additional specimen was prepared in the same way as the specimen for the evaluation of luminous efficiency, and the fluorine contents in the protective layers were measured, as in Example 1.

[Evaluation of Organic EL Device]

As described above, the luminescence properties of the organic EL device thus formed were determined before and after an endurance test under high temperature and high humidity.

The organic EL device was subjected to an endurance test in an atmosphere of 90% RH at 60° C. for 1000 hours, as in Example 2. The luminescence properties were determined after the endurance test. Table 4 shows the results.

When the first protective layer composed of silicon, oxygen, and hydrogen and free of nitrogen contained 0.01 to 4.0 atomic percent of fluorine according to the present invention, deterioration in luminance under high temperature and high humidity was reduced, and no dark spot was observed. The results demonstrated that an organic EL device according to the present invention exhibited high stability.

TABLE 3

| Sample No. | Fluorine content in first protective layer (atomic %) | Fluorine content in second protective layer (atomic %) | Deterioration rate in endurance test (relative value) | Luminance after endurance test and drop impact test (relative value) |
| --- | --- | --- | --- | --- |
| Comparative example | 0.005 | 0.1 | 80.0 | 85.5 |
| Comparative example | 0.08 | | 81.0 | 86.0 |
| Example 2-1 | 0.01 | | 98.5 | 98.5 |
| Example 2-2 | 0.1 | | 99.0 | 99.5 |
| Example 2-3 | 0.6 | | 99.5 | 98.5 |
| Example 2-4 | 1.0 | | 100.0 | 100.0 |
| Comparative example | 1.2 | | 85.0 | 85.5 |

Deterioration rates in endurance test and Luminances after endurance test and drop impact test are relative values normalized to the values of Example 2-4.

Example 3

A specimen including a glass substrate 21, a TFT circuit 22, a device isolation film 23, a first electrode 24, an organic layer 25, and a second electrode 26 was formed in the same way as in Example 2.

Then, the specimen was conveyed to another film-forming chamber. A first protective layer 27 composed of silicon, oxygen, hydrogen, and fluorine and free of nitrogen was formed on the second electrode 26. The first protective layer 27 had a thickness of 1.5 µm. The fluorine content in the first protective layer 27 was adjusted to the value shown in Table 4 by controlling the film-forming conditions. As in Example 2, while the contents of silicon, oxygen, and hydrogen in the first protective layer 27 varied with the adjustment of the fluorine content, they were within the range described above.

After the film formation was temporarily stopped, a raw material gas was changed. Then, a second protective layer 28

TABLE 4

| Sample No. | Fluorine content in first protective layer (atomic %) | Fluorine content in second protective layer (atomic %) | Deterioration rate in endurance test (relative value) |
| --- | --- | --- | --- |
| Example 3-1 | 0.005 | 1.0 | 85.0 |
| Example 3-2 | 0.08 | | 88. |
| Example 3-3 | 0.01 | | 99.5 |
| Example 3-4 | 0.1 | | 98.5 |
| Example 3-5 | 1.0 | | 100.0 |
| Example 3-6 | 2.0 | | 99.0 |
| Example 3-7 | 4.0 | | 98.5 |
| Example 3-8 | 4.5 | | 90.0 |

Deterioration rates in endurance test are relative values normalized to the values of Example 3-5.

Example 4

A specimen including a glass substrate 21, a TFT circuit 22, a device isolation film 23, a first electrode 24, an organic layer 25, and a second electrode 26 was formed in the same way as in Example 1.

As in Example 1, a first protective layer 27 composed of silicon, nitrogen, hydrogen, and fluorine was formed on the second electrode 26. The first protective layer 27 had a thickness of 2 μm. The fluorine content in the first protective layer 27 was gradually changed in a direction from the substrate side toward the display side of the organic EL device, as shown in Table 5. After the film formation was temporarily stopped, a second protective layer 28 having a varied fluorine content shown in Table 5 was formed on the first protective layer 27. The second protective layer 28 had a thickness of 1 μm.

As in Example 1, while the contents of silicon, nitrogen, and hydrogen in the first protective layer 27 varied with the adjustment of the fluorine content, they were within the range described above.

The organic EL device thus formed was connected to a driving power supply at the first electrode 24 and the second electrode 26. The luminous efficiency of the organic EL device was determined. An additional specimen was prepared in the same way as the specimen for the evaluation of luminous efficiency, and the fluorine contents in the protective layers were measured, as in Example 1.

[Evaluation of Organic EL Device]

As described above, the luminescence properties of the organic EL device thus formed were determined before and after an endurance test under high temperature and high humidity.

An organic EL device including the protective layers having fluorine contents shown in Table 5 was subjected to an endurance test in an atmosphere of 90% RH at 60° C. for 1000 hours, as in Example 1. The luminescence properties were determined before and after the endurance test. Table 5 shows the results.

The results demonstrated that an organic EL device according to the present invention, in which a first protective layer and a second protective layer are laminated, and the fluorine content in each protective layer is in the range of 0.01 to 1.0 atomic percent and decreases in a direction from the substrate side toward the display side, showed less deterioration in protective performance under high temperature and high humidity and thereby exhibited high stability. The continuously varied fluorine content gave excellent results.

TABLE 5

| Sample No. | Fluorine content in first protective layer (atomic %) | Fluorine content in second protective layer (atomic %) | Deterioration rate in endurance test (relative value) |
| --- | --- | --- | --- |
| Example 4-1 | 1.0-0.6 | 0.5-0.01 | 100.0 |
| Example 4-2 | 0.5-0.1 | 0.09-0.01 | 99.0 |
| Example 4-3 | 1.0-0.5 | 0.5-0.1 | 100.0 |
| Example 4-4 | 1.0 | 0.1 | 98.0 |
| Comparative example | 2.0-0.5 | 0.5-0.1 | 88.0 |
| Comparative example | 1.0-0.5 | 0.5-0.0 | 87.0 |

Deterioration rates in endurance test are relative values normalized to the values of Example 4-1.

Example 5

A specimen including a glass substrate 21, a TFT circuit 22, a device isolation film 23, a first electrode 24, an organic layer 25, and a second electrode 26 was formed in the same way as in Example 3.

As in Example 3, a first protective layer 27 composed of silicon, nitrogen, hydrogen, and fluorine was formed on the second electrode 26. The first protective layer 27 had a thickness of 3 μm. The fluorine content in the first protective layer 27 was adjusted to the value shown in Table 6 by controlling the film-forming conditions.

In Examples 5-1, 5-2, and 5-3, after the formation of the first protective layer 27, the film-forming conditions were gradually changed to form a second protective layer 28 containing fluorine as shown in Table 6 under continuous discharge. In Examples 5-4 and 5-5, after the first protective layer was formed, the film formation was temporarily stopped. Then, the second protective layer was laminated.

As in Example 3, while the contents of silicon, nitrogen, and hydrogen in the protective layers varied with the adjustment of the fluorine content, they were within the range described above.

The luminous efficiency of an organic EL device including the protective layers was determined, as in Example 3. An additional specimen was prepared in the same way as the specimen for the evaluation of luminous efficiency, and the fluorine contents in the protective layers were measured, as in Example 3.

[Evaluation of Organic EL Device]

As described above, the luminescence properties of the organic EL device thus formed were determined before and after an endurance test under high temperature and high humidity.

As seen in FIG. 6, the organic EL devices according to Examples 5-1 to 5-5 exhibited excellent performance. Specifically, when the first protective layer and the second protective layer are laminated and the fluorine content in each protective layer is in the range of 0.01 to 1.0 atomic percent, the organic EL device showed less deterioration in luminescence properties under high temperature and high humidity and thereby exhibited high stability.

Furthermore, the organic EL devices according to Examples 5-1 to 5-3, in which the first protective layer and the second protective layer were continuously formed, had almost the same deterioration rates and exhibited high stability.

TABLE 6

| Sample No. | Fluorine content in first protective layer (atomic %) | Fluorine content in second protective layer (atomic %) | Continuity between first and second protective layers | Deterioration rate in endurance test (relative value) |
| --- | --- | --- | --- | --- |
| Example 5-1 | 1.0 | 0.5 | continuous | 100.0 |
| Example 5-2 | 0.5 | 0.1 | continuous | 99.5 |
| Example 5-3 | 0.5 | 0.01 | continuous | 99.0 |

TABLE 6-continued

| Sample No. | Fluorine content in first protective layer (atomic %) | Fluorine content in second protective layer (atomic %) | Continuity between first and second protective layers | Deterioration rate in endurance test (relative value) |
|---|---|---|---|---|
| Example 5-4 | 1.0 | 0.5 | discontinuous | 99.5 |
| Example 5-5 | 0.5 | 0.1 | discontinuous | 99.0 |

Deterioration rates in endurance test are relative values normalized to the values of Example 5-1.

This application claims the benefit of Japanese Application No. 2005-370091 filed Dec. 22, 2005, which is hereby incorporated by reference herein in its entirety.

What is claimed is:

1. A top emission organic electroluminescent device comprising:
a substrate;
a layered structure including a first electrode, an organic layer, and a second electrode disposed on the substrate in this order, and
a SiN layer disposed closer to a light extraction side than the second electrode;
wherein the SiN layer contains 10 to 50 atomic percent of hydrogen and 0.01 to 1 atomic percent of fluorine.

2. A top emission organic electroluminescent device according to claim 1, wherein the SiN layer contains 29 to 40 atomic percent of silicon.

3. A top emission organic electroluminescent device comprising:
a substrate;
a layered structure disposed on the substrate, said layered structure includes a first electrode, a second electrode, and an organic layer disposed between said first electrode and said second electrode, and
a protective layer disposed closer to a light extraction side than said layered structure;
wherein the protective layer contains silicon, nitrogen, 10 to 50 atomic percent of hydrogen, and 0.01 to 1 atomic percent of fluorine.

4. A top emission organic electroluminescent device according to claim 3, wherein the protective layer contains 29 to 40 atomic percent of silicon.

* * * * *